(12) United States Patent
Sugawara

(10) Patent No.: US 7,109,518 B2
(45) Date of Patent: Sep. 19, 2006

(54) ELECTRONIC ELEMENT OPERABLE AT ROOM TEMPERATURE USING SUPER-DIELECTRIC PHENOMENON

(75) Inventor: Masanori Sugawara, Kanagawa (JP)

(73) Assignee: Yokohama TLO Company, Ltd., Kanagawa (JP)

( * ) Notice: Subject to any disclaimer, the term of this patent is extended or adjusted under 35 U.S.C. 154(b) by 663 days.

(21) Appl. No.: 10/312,031

(22) PCT Filed: Jun. 19, 2001

(86) PCT No.: PCT/JP01/05205

§ 371 (c)(1),
(2), (4) Date: Dec. 19, 2002

(87) PCT Pub. No.: WO01/99196

PCT Pub. Date: Dec. 27, 2001

(65) Prior Publication Data

US 2003/0106483 A1 Jun. 12, 2003

(30) Foreign Application Priority Data

Jun. 19, 2000 (JP) .............................. 2000-183296

(51) Int. Cl.
H01L 29/06 (2006.01)

(52) U.S. Cl. .......................................... 257/31; 505/190
(58) Field of Classification Search .................. 257/31; 505/190, 702
See application file for complete search history.

(56) References Cited

OTHER PUBLICATIONS

Sugahara et al., Anomalous AC Dielectric Response and Carrier State of C-Axis Oriented $La_{2-x}Sr_xCuO_4$ Films, Physica C 293, 1997, 216-219.
Sugahara et al., Experimental Evidence of Pairing Fractional Quantum Hall Effect State in High Temperature Oxide Superconductors . . . , Physica C 317-318, 1999, 618-620.

*Primary Examiner*—Sara Crane
(74) *Attorney, Agent, or Firm*—Gary C Cohn PLLC

(57) ABSTRACT

This invention relates to an electronic element having an electron function which acts even at room temperature using a super dielectric effect. The element has a crystalline electron system, and uses a perovskite crystal in the ground state of a "macroscopic quantum effect" which occurs when the electron number is defined, or nearly defined. The electronic element used in an electric field such that the two-dimensional plane of doped crystals ground state of a "fractional quantum Hall effect" wherein the doping amount of the crystals is 0.05 or less, or if localization is introduced, 0.6 or less, and the crystals may have a doping amount variation determined by the degree of localization.

14 Claims, 4 Drawing Sheets

ELECTRONIC ELEMENT OPERABLE AT ROOM TEMPERATURE USING SUPER-DIELECTRIC PHENOMENON

FIELD OF THE INVENTION

This invention relates to an electronic element having an electron function which acts even at room temperature using a super dielectric effect. The element has a crystalline electron system, and uses a perovskite crystal in the ground state of a macroscopic quantum effect which occurs when the electron number is defined, or nearly defined (an effect shown by samples of macroscopic dimensions of the order of mm and cm wherein a large number of particles behave like a single particle). This "super dielectric effect" is a dual effect (a property wherein magnetic flux and current, etc., correspond to charge and field) of superconductivity which is a "macroscopic quantum effect" with a defined phase. The characteristics of the superconductor are as follows.
(i) The magnetic flux penetrating the "superconductor" tends to be expelled. (ii) The relation between the vector potential A and current density j is such that j/A is negative. (iii) The magnetic flux penetrating the "superconductor" is quantized by a "magnetic flux quantum" $\Phi_0$. (iv) If the magnetic flux $\Phi$ crosses between two junctions of the "superconductor", the junction current will oscillate by $I=I_0 \sin(2\pi\Phi/\Phi_0)$ ("Johnson effect", $I_0$ is constant). As the dual effect, "super dielectric effect" has the following properties. (i') The charge which penetrates the interior tends to be expelled. (ii') The relation between the electrical potential V and charge Q is such that Q/V is negative (electrostatic capacitance C=Q/V is negative). (iii') The charge penetrating the "super dielectric" is quantized by a "fractional quantum Hall effect charge" $Q_0$. (iv') When a charge Q passes between two layers of the "super dielectric", the junction voltage oscillates with $V=V_0 \sin(2\pi Q/Q_0)$ (dielectric interference effect, $V_0$ is constant).

BACKGROUND OF THE INVENTION

A "Johnson element", which is an example of an electronic element using a "macroscopic quantum effect" wherein two superconductors are joined together via a thin insulating barrier, is known in the art. In this element, the junction current which is a function of the magnetic flux, periodically varies with a unit flux quantum of $\Phi_0$ according to $I=V_0 \sin(2\pi Q/Q_0)$. Using this element, an electronic circuit can be constructed having one flux quantum of $\Phi^0=2\times10^{-15}$ [Wb] as an information unit.

However, as this element uses a superconductor, a low temperature environment such as liquid helium temperature or liquid nitrogen temperature is required, and as it has an operational limiting frequency of 1 THz, it is not much faster than a semiconductor element.

A "single electron tunnel element" is also known which does not use the macroscopic quantum effect, wherein, by giving the element a small electrostatic capacitance, the movement of other electrons is suppressed by the increase of Coulomb energy produced by the movement of one electronic charge ($e=1.6\times10^{-19}$ [C]), one electronic charge being used as one information unit. It is considered that, for an element having dimensions of approximately 100 nanometers, a low temperature environment such as that of liquid helium is required for stable operation. To permit stable operation at room temperature, the element dimensions must be reduced to several nanometers or less in order to reduce electrostatic capacitance. In addition, the usual electrodes and wires cannot be attached, and as it has an operational limiting frequency of about 1GHz, its performance is also inferior to that of a semiconductor element.

Problems Which this Invention Aims to Solve

Hence, the electronic element using the "macroscopic quantum effect" or the single electron tunnel element of the related art require a low temperature environment, and an electronic element using the "macroscopic quantum effect" which operates at room temperature was desired.

Means to Solve the Above Problems

This invention is an electronic element used in an electric field such that the two-dimensional plane of doped crystals forming the electronic element is effectively perpendicular to the electric field, and which can be used at room temperature. The element is in a ground state wherein the "fractional quantum Hall effect" is stable. The doping amount of the crystals is 0.05 or less, or if localization is introduced, 0.6 or less, and the crystals may have a doping amount variation determined by the degree of localization.

The thickness of the electronic element may be effectively n/2 (n is an integer equal to one or more) times the plasma oscillation wavelength of the electrons in the crystal.

DETAILED DESCRIPTION OF THEN INVENTION

The electronic element of this invention is an element using the property dual to "superconductivity" based on a "macroscopic quantum effect" having a definite particle number, and uses a "fractional quantum Hall effect" particle charge of the order of the charge of an electron, as information unit. There is no basically no dimensional limitation such as with the single electron tunnel element, and it operates stably even at room temperature. The operating frequency confirmed by experiments was 30 THz, but the limiting frequency is even higher.

The electronic element of this invention is used in an electric field such that the two-dimensional crystal plane is effectively perpendicular to the electric field.

The crystals forming this electronic element may be organic or inorganic crystals, provided that they have a two-dimensional plane described in detail hereafter. This crystal may be a perovskite crystal, but $SrTiO_3$ or $La_2CuO_4$ are more preferred.

Figure 1:
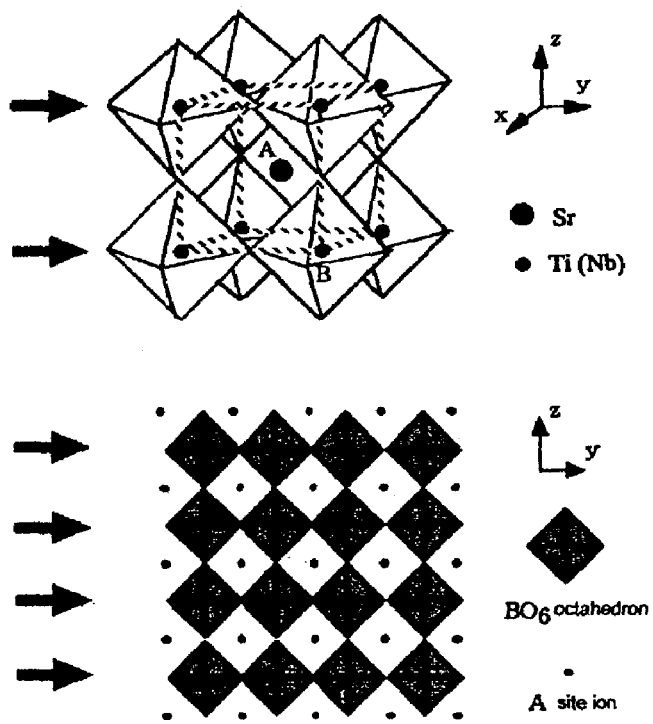
FIG. 1 is a diagram showing the crystal structure (basic perovskite crystal structure) of $SrTiO_3$ and $SrTi_{1-x}Nb_xO_3$. The arrow shows the two-dimensional plane.
Figure 2:
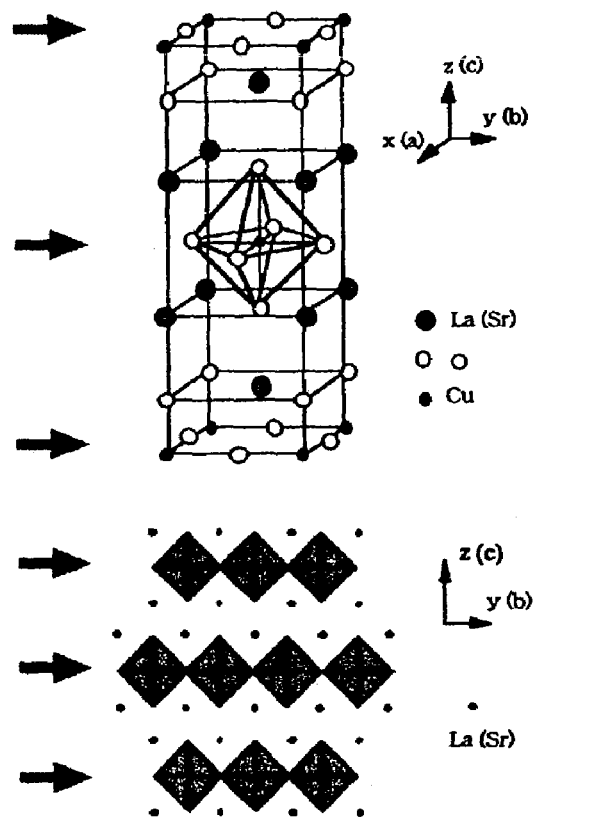
FIG. 2 is a diagram showing the crystal structure (laminar perovskite crystal structure) of $La_2CuO_4$ and $La_{2-x}Sr_xCuO_4$. The arrow shows the two-dimensional plane. The upper left part of FIG. 3 shows the structure of electrostatic capacitance elements $C_f$. $C_{STO}$ used for measurements. The upper right part of FIG. 3 shows the relation between the filling factor of a "fractional quantum Hall effect daughter state" and a doping amount. The lower part of FIG. 3 shows the observed dependence of $C_f/C_{STO}$ on the doping amount.

A perovskite crystal may be a "basic perovskite crystal structure" such as $SrTiO_3$, $Sr_xCuO_3$, $SrTi_{1-x}Nb_xO_3$ shown in FIG. 1, or a laminar perovskite crystal such as $La_2CuO_4$ and $La_{2-x}Sr_xCuO_4$ shown in FIG. 2. The chemical composition of the basic perovskite crystal is $ABO_3$ (A, B are metal elements, O is an oxygen ion), comprising metal A ions of large ionic radius at the centre (½, ½, ½) of a cubic crystal unit cell, and metal B ions of small ionic radius at the origin (0,0,0). Oxygen ions surround the metal B ions to form a $BO_6$ octagon. The adjacent octagon shares oxygen at the apices, and has three-dimensional continuity.

The insulator strontium titanate $SrTiO_3$, and the conducting crystal $SrTi_{1-x}Nb_xO_3$ doped with Nb, are basic perovskite crystals wherein Sr is the ion A and Ti(Nb) is the ion B. On the other hand, the insulator $La_2CuO_4$ crystals and the $La_{2-x}Sr_xCuO_4$ crystals doped with Sr (a type of high temperature superconductor), are an example of a laminar perovskite crystal wherein the laminar octagonal structure of FIG. 2 forms a two-dimensional electroconducting layer.

The crystals of this invention are carrier-doped, and produce mobile carrier charges wherein some of the elements in the insulator are substituted with other elements of different ionic values. For example, as two of the six 3p valence electrons of $Ti^{+4}$ in $SrTiO_3$ fill one band, they make three bands, and these bands are filled. Therefore, $SrTiO_3$ is an insulator in the solid theoretical sense. $SrTi_{1-x}Nb_xO_3$ is doped with Nb (one $Ti^{+4}$ is substituted by x $Nb^{+5}$), and an electronic carrier is produced from x conduction bands. When an electric field is applied to the z axis, x electrons per Ti are introduced in the filled bands in the equipotential xy plane, and this becomes a conductor moving in a two-dimensional plane. On the other hand, in $La_{2-x}Sr_xCuO_4$ crystals wherein the insulator $La_{2-x}Sr_xCuO_4$ is doped with Sr (one $La^{+3}$ is substituted by x $Sr^{+2}$), x positive hole carriers are produced for each Cu in the two-dimensional plane, and this shows two-dimensional conductivity.

Localization may also be introduced into the crystals of the electronic element of the present invention. In the related art, in high temperature superconductors, superconductor properties were easily destroyed by the introduction of a small amount of localization. However, in the fractional quantum Hall effect, the introduction of a suitable amount of localization broadens the carrier amount in the ground state, and renders the effect more easily observable (e.g., translation by Hisashi Nishimura, "Quantum Hall Effect", Shupringer Ferrac, Tokyo (1989), p177, R. B. Laughlin). This "introduction of localization" means that, due to the distribution in the crystal of a potential which scatters electrons produced by impurities or defects, the electrons cannot move easily and electrical resistance increases (e.g., "Latest Advances in Physics 2", ed. Yoshihiko Otsuki, published by Kyoritsu Ltd. (1982), p50, Hidetoshi Fukuyama "Anderson Localization").

In the electronic element of this invention, if the doping amount is 0.05 or less but preferably 0.03 or less, the effect of the present invention is obtained whether localization is introduced or not.

If localization is introduced, the effect of this invention is likewise obtained even at 0.6 or less, or typically 0.1–0.5.

The term "two-dimensional plane" is also referred to as a valence electron two-dimensional network, which is a repeating plane appearing in the crystal. In this two-dimensional plane, two intersecting axes, i.e., a vertical and horizontal axis, are formed which allow easy charge movement. This plane refers to the plane which confers two-dimensional conduction properties on charges in the vertical and horizontal directions due to the production of electrons or positive holes by doping (e.g., "The Science of High-Temperature Superconduction", ed. Sho Tachiki, Shokabo (1999), p44.)

For example, in the perovskite crystal structure ($SrTiO_3$) of FIG. 1, this is a continuous plane formed by Ti and O, and corresponds to the "two-dimensional plane" parallel to the (001) plane when an electric field is applied in the z axis direction, to the (010) plane when it is applied in the y axis direction, and to the (100) plane when it is applied in the x axis direction. In the $La_2CuO_4$ and $La_{2-x}Sr_xCuO_4$ crystals of FIG. 2, the "two-dimensional plane" is a continuous plane formed by Cu and O, and in this case the electric field is applied in the z axis direction. x positive hole carriers are produced per Cu on the "two-dimensional plane", and show two-dimensional conduction properties.

The electronic element of the present invention may be used at room temperature, meaning that is not necessary to lower the temperature using liquid helium or liquid nitrogen, however this does not exclude its use at these temperatures. Room temperature refers to ambient conditions wherein there is normally no man-made cooling or warming, and is normally of the order of 20° C.

The electronic element of this invention is used in an electric field, and the two-dimensional plane in the doped crystals forming the electronic element is disposed substantially perpendicular to the electric field. In this invention, the electric field is normally used within a range where the charge is $10-10^4$ [pC]. The thickness of the crystals of the electronic element is of the order of 1 mm or less, preferably 10–500 nanometers but more preferably 50–200 nanometers. The voltage is 100V or less, but preferably 1–50V. A remarkable change of capacitance is observed at a voltage of 10V or less. Further, although the electric field is ideally perpendicular to the two-dimensional plane of the crystals, the same performance is still obtained without problems even if it is slightly offset, e.g., it may be inclined is about 10 degrees from the vertical.

The "fractional quantum Hall effect" is a highly stabilized phenomenon, where the charge can exist stably when a strong magnetic field (in this invention, an equivalent strong magnetic field due to plasma oscillation) is applied perpendicularly to a two-dimensional electron layer, and when a charge is introduced in a proportion of 1/n (n=integer) at sites (this is referred to as "filling factor"=1/n) (e.g., "Multi-Electron Theory III-Fractional Quantum Hall Effect", revised by Hideo Aoki, Tokyo University Press (1999)). This is a dual effect of "superconductivity" which is a "macroscopic quantum effect" wherein the magnetic flux is indefinite but the charge is definite, or a "macroscopic quantum effect" wherein the charge is definite but the magnetic flux is indefinite.

This "electron number definiteness" means that the number of electrons is defined, such as the number of valence electrons in filled bands in the crystal in the insulating state. This is clear from the fact that there is no excess-charge exchange between the outside and the charge system. Even in the case of a small amount of carrier doping, the valence electron state within the crystal is close to that of an insulator, and the valence electron system is close to "electron number definiteness". On the other hand, in the case of carrier doping which is not a small amount, when localization is introduced so that carrier charges exist locally (when they are fixed spatially), the local charge amount is definite, so a state close to "electron number definiteness" can be realized.

The "ground state" of the "fractional quantum Hall effect" means that, when single electrons are the basic particles, "filling factor"=1/odd number is realized as in the case of a two-dimensional electron layer of the semiconductor, and that when the electrons form electron groups of two or four which are the basic particles, "filling factor"=1/even number is realized, as in the case of this invention. Further, in the case of this invention, the ground state is the most stable situation when the "filling factor"=½ (this is referred to as "parent state"), and this is realized when the doping amount is 0. However, this state is an insulator, so its applications are limited. When carrier doping is performed, many "daughter states" appear from the "parent state", and these are also stabilized. The "filling factors" of the "daughter states" are $2/5, 4/9, 6/13, 8/17, 10/21 \ldots$ The "doping amounts" corresponding to this are 0.200, 0.111, 0.0769, 0.0588, 0.0476 in the case of a $La_{2-x}Sr_xCuO_4$ crystal, and 0.400, 0.222, 0.154, 0.118, 0.0952 ... in the case of a $SrTi_{1-x}Nb_xO_3$ crystal.

Further, if localization is introduced, the electronic element of this invention still exhibits its effect even when some width occurs in the doping amount which generates stable states of the "parent state" and "daughter states", i.e., if the doping amount shifts by this width from the value which strictly gives the "parent state" and "daughter states". This width is obtained by dividing the "effective scattering potential" value responsible for localization properties, by the "state density".

Carrier doping refers to the loss of charge equilibrium due to the substitution of part of the elements in the crystal by elements having different valence electrons, and the introduction of charges which can move within the crystal. For example, in $La_2CuO_4$, in a $La_{2-x}Sr_xCuO_4$ crystal wherein part of the Group III La is substituted by Group II Sr, x hole carriers are introduced per Cu atom.

"Plasma oscillation" refers to a repetitive electrical oscillation wherein the electron system shifts in the direction away from the equilibrium position which neutralizes the background of positive ions and an electrostatic force is produced tending to restore it, but it does not stop at the equilibrium position due to inertia and shifts to the opposite direction, whereupon an electrostatic force again tends to restore it. The plasma oscillation wavelength $\lambda_p$ relative to the valence electrons system in the crystal (frequency limit) is expressed by the following equation (1):

$$\lambda_p = 2\pi c (\in M/N_e Q^2)^{1/2} \quad (1)$$

(where, in the equation, c is the speed of light, $\in$ is the dielectric constant of the crystal, M is the valence electron mass, $N_e$ is the valence electron density, Q is the valence electron charge).

The electronic element of this invention may be manufactured for example by any of the following methods:

(i) a single crystal is produced by the "Czochralski method" or "zone melting method", this is made into a thin layer, and electrodes are attached.

(ii) a thin film crystal is made from a solid target by "sputtering", and electrodes are attached.

(iii) a thin film crystal is prepared from a vapor phase by "CVD (Chemical Vapour Deposition)", and electrodes are attached.

(iv) All elements having a multi-layer construction are prepared by crystal growth by the "MBE" method.

In the electronic element of this invention, the voltage periodically fluctuates due to the passage of small charges of the order of an electron charge through the crystal, so the following applications may be envisaged.

(1) Super-high Speed Information Processing Circuit using Charges of the Order of the Charge on an Electron as Information Medium Electronic circuits can be manufactured wherein charges of the order of the charge on an electron are information units, and which operates at room temperature.

As the operating speed of each element is 30 THz or higher, a super high speed information processing circuit exceeding the characteristics of the semiconductor information processing circuit of the related art, can be constructed.

(2) Electromagnetic Wave Element using Optical Detection or Optical Oscillation, etc.

If the mutual interaction with coherent light is used, an optical frequency can be selected from the element current, so this may be used as an optical tuner. Also, the phase of the light can be distinguished, so it can be used as an optical detector comprising a phase effect.

(3) Gate Element for Quantum Computing

The quantum state is maintained for a long time, and the most rigorous conditions for a quantum computing element are satisfied.

EXAMPLES

The following examples are given only to confirm the effect of the invention, and are not intended to limit the invention in any way.

In the following examples, to facilitate observation, "an initialization step" is performed on thin film of thin plate (001) crystal of a perovskite crystal insulator/conductor, wherein (i) a special sample structure is sandwiched between the metal plates, and (ii) charge and magnetic flux trapped before measurement, is eliminated by heating, etc., and a sufficient electric field/magnetic field shielding is used during measurements to eliminate unwanted external fields.

Example 1

Figure 3:
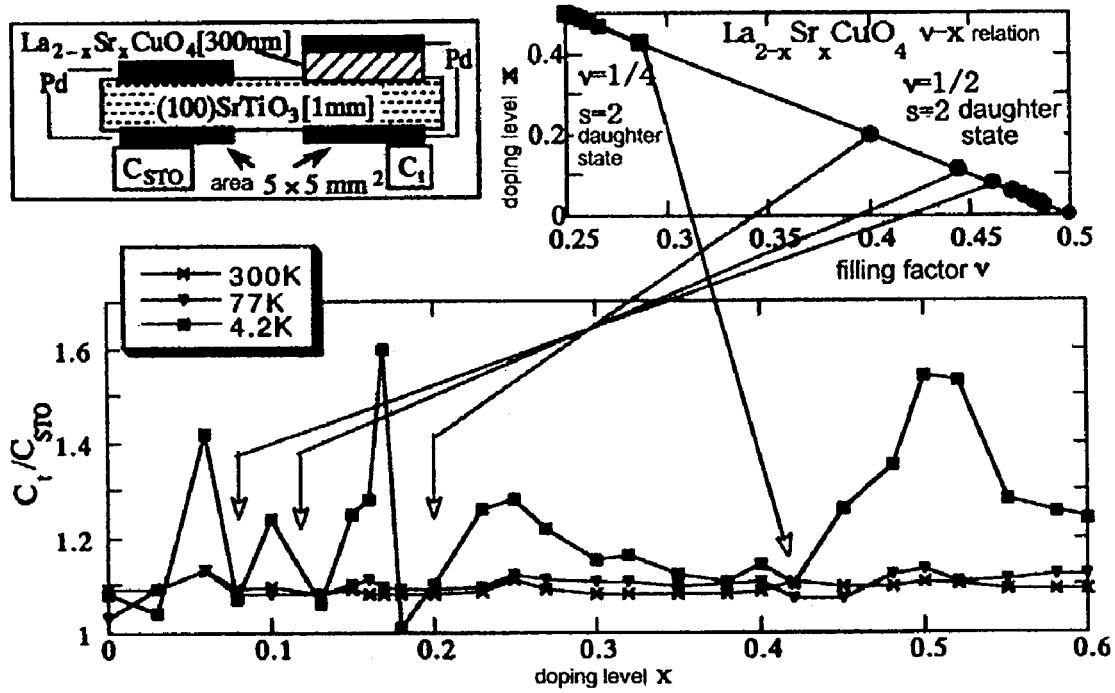

Relation Between Fractional Quantum Hall Effect and Super Dielectric Effect of Electronic Element An electronic element having the sample shape in the upper left part of FIG. 3 was manufactured according to the following procedure. A 50 nanometer Pd thin film was grown by vacuum vapour deposition without substrate heating parallel to the (100) plane on both surfaces of a Furuuchi Chemicals (100) $SrTiO_3$ single crystal double-surface optically polished substrate (surface area 10×20 mm², thickness 1 mm), and shaped by dry etching to form an electrostatic capacitance structure known as a Pd/(100)$SrTiO_3$/Pd $C_{STO}$ of surface area 5×5 mm2. Also, a $La_{2-x}Sr_xCuO_4$ thin film was grown in part of the same substrate using a high frequency magnetron sputtering apparatus from a solid target of $La_{2-x}Sr_xCuO_4$ at a substrate temperature of 700° C. at an input power of 70W in a $Ar/O_2$ gas mixture at 8 Pa, such that its (100) plane (xy plane, i.e. two-dimensional plane) was parallel to the aforesaid (100) $SrTiO_3$ single crystal plane and Pd thin film, and such that its thickness was 300 nm. After growing, "in situ annealing" was performed in oxygen at $5\times10^3$ Pa at 700° C. for 1 hour. The oxygen was then removed and the sample gradually cooled in a vacuum. Subsequently, a 50 nanometer Pd thin film was grown by vacuum vapour deposition without substrate heating on the thin film upper surface and substrate undersurface, and shaped by dry etching to form an electrostatic capacitance known as a $C_t$ of a $Pd/(100)SrTiO_3/(001)$ $La_{2-x}Sr_xCuO_{4-o}/$ Pd structure of surface area $5\times5$ $mm^2$. In this case, an oxygen deficit where $\sigma$ was of the order of 0.01 was produced during cooling, and localization was introduced into the crystal. For other high-temperature super conductors, the doping amount varies largely due to the oxygen deficit, but for $La_{2-x}Sr_xCuO_{4-o}$, the variation of the doping amount due to the oxygen deficit is 0.01 or less. The resistivity and temperature characteristics in the (//ab) direction were identical, except that a superconductivity transition was not performed. According to X-ray diffraction measurements, the crystallinity was good when x was less than ¼, but declined when x was larger than ¼.

An electric field of frequency 10 kHz and alternating current amplitude 1Vpp was applied so that it was perpendicular to the (001) plane of the aforesaid $La_{2-x}Sr_xCuO_4$ thin film of this electronic element, using a NF Electronics Instruments digital LCZ#2330A meter, and various electrostatic capacitances were measured.

The measurement temperatures were room temperature, 77K and 4.2K. The relation between the ratio ($C_t/C_{STO}$) of $C_t$ and $C_{STO}$ measured at each temperature and the doping amount is shown in the lower part of FIG. 3. Each point is the average of the measurement values for plural samples. As a result, the following was determined.

(i) $C_t/C_{STO}$ is larger than 1 over the whole observation range.

(ii) When the doping amount is 0.200, 0.111, 0.0769 and in the vicinity of 0, a sharp drop of $C_t/C_{STO}$ was observed. This corresponds to the aforesaid "parent state" and "daughter states" of the "fractional quantum Hall effect".

(iii) $C_t/C_{STO}$ increases remarkably on both sides of these doping amounts.

From these results, the following facts can be concluded.

(i) The electrostatic capacitance may become negative for the "super dielectric effect" as described above. From the aforesaid results, the electrostatic capacitance $C_{LCSO}$ corresponding to the $La_{2-x}Sr_xCuO_{4-o}$ thin film part is negative. From the formula known for an electrostatic capacitance connected in series, $C_t^{-1} = C_{STO}^{-1} + C_{LSCO}^{-1}$, it is seen that $C_{STO}$ is only larger than 1 when $C_{STO}$ is negative. This fact shows that a $La_{2-x}Sr_xCuO_{4-o}$ thin film into which localization was introduced, has "super dielectric properties".

(ii) If some experimental error is allowed, the measurement results show that $C_t/C_{STO}$ decreases in the "parent state" and "daughter states" predicted from theory. This shows that the charge of $C_{LSCO}$ does not vary even if the voltage does vary. Theoretically, the "parent state" and "daughter states" are stable states wherein the electron number is defined, which may be interpreted as being a reflection of the property which does not permit fluctuation of charge. It may be understood that in the region of the corresponding doping amounts, the "electron-number-definite" condition is relaxed, and the effect of "negative electrostatic capacitance" is largely manifested.

This "electron-number-definite" condition is important in applications similar to "single electronic transistors" using the "super dielectric effect". Specifically, the energy increase of the system becomes larger when there is a variation of one "fractional quantum Hall effect particle charge", and as a result, the "fractional quantum Hall effect particle charges" moving at once between "fractional quantum Hall effect planes" are limited to about one.

Example 2

Relation Between Film Thickness and Super Dielectric Effect of Electronic Element An electronic element was manufactured in an identical way to that of Example 1, except that the surface area of the electrostatic capacitance structure was 7 $mm^2$, and the doping amount was 0.15.

Figure 4:
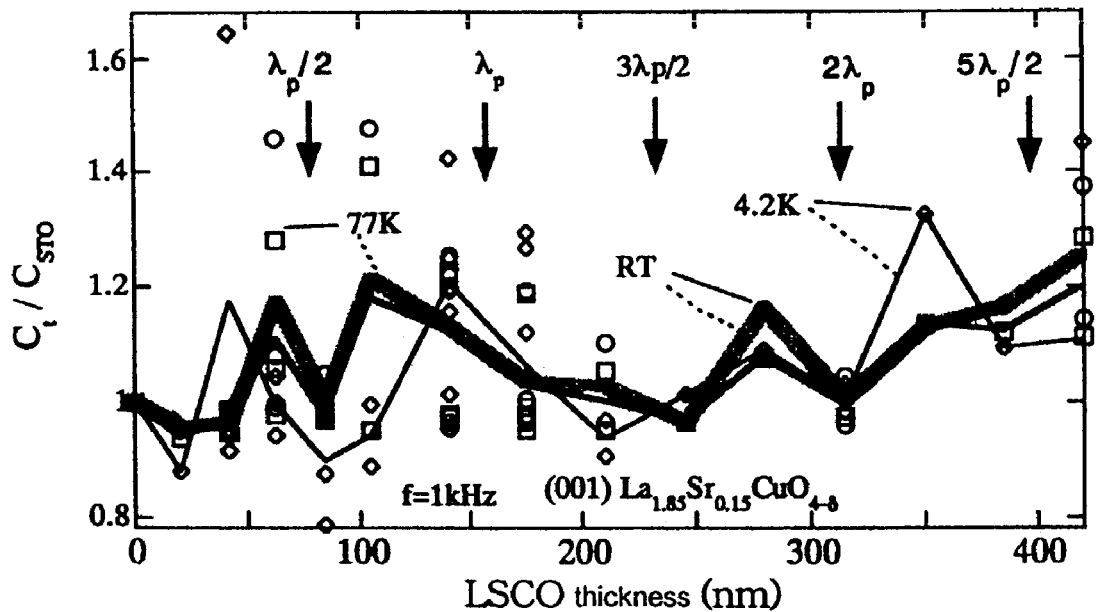
FIG. 4 shows the dependence of the electrostatic capacitance ratio $C_f/C_{STO}$ on the film thickness of a $La_{2-x}Sr_xCuO_{4-o}$ thin film. The doping amount is 0.15.

A test was performed in an identical way to that of Example 1, using an identical measurement instrument to that of Example 1, at a frequency of 1 KHz, voltage of 1Vpp and temperatures of room temperature, 77K and 4.2K. The results are shown in FIG. 4. The broken line is the average value of the measurement values for each temperature and film thickness.

As can be seen from FIG. 4, $C_t/C_{STO}$ decreases when the film thickness of a $La_{2-x}Sr_xCuO_{4-o}$ thin film is a specific value. Regarding the film thickness when there is a decrease, if the plasma oscillation wavelength of Equation (1) is calculated for $La_{2-x}Sr_xCuO_4$, $\lambda_p$ is approximately 150 nm. Using this result, the film thickness when $C_t/C_{STO}$ decreases is equivalent to $n\lambda_p/2$ (n is an integer). Referring also to the argument of Example 1, this result shows that, when the film thickness is varied, the "super dielectric properties" of a $La_{2-x}Sr_x$-$CuO_{4-o}$ thin film are stabilized when the plasma oscillation resonates geometrically. This means, in other words, that when use is made of the "super dielectric properties", good results are obtained by setting the crystal film thickness in the vicinity of $n\lambda_p/2$.

Example 3

Single Charge Interference Due to Quantum Resonance with Laser Light

Figure 5:
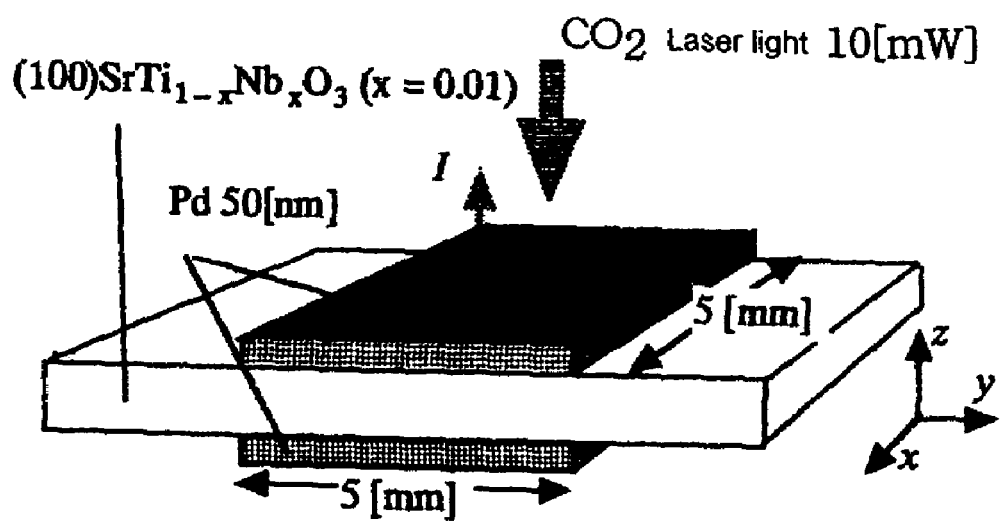
FIG. 5 shows the element structure used in laser irradiation experiments.
Figure 5:
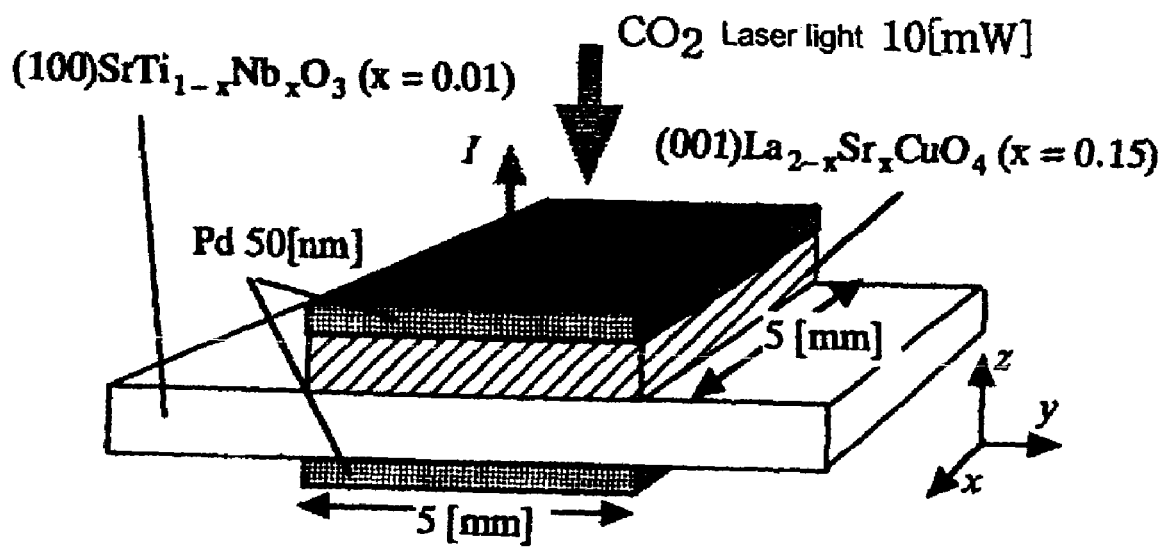

The form of the electronic element used for laser light and quantum resonance is shown in FIG. 5. In the electronic element in the upper part of FIG. 5, the (100) plane (i.e., two-dimensional plane) of $SrTi_{1-x}Nb_xO_3$ crystal was disposed parallel to a Pd film, and its thickness was 1 mm. On the other hand, in the electronic element in the lower part of FIG. 5, a $La_{2-x}Sr_xCuO_{4-o}$ film was added to the electronic element in the upper part of FIG. 5, the (001) plane (i.e., two-dimensional plane) of $La_{2-x}Sr_xCuO_{4-o}$ film crystal was disposed parallel to the (100) plane of the aforesaid $SrTi_{1-x}Nb_xO_3$ crystal and the Pd film, and its thickness was 100 nm. During manufacture, it is important that the crystal surface (end region) part which directly connects the electrodes has a good surface state, so the $La_{2-x}Sr_xCuO_{4-o}$ thin film was manufactured by the laser vapor deposition method which makes it relatively easy to obtain good crystallinity. The film was grown using a MPB Co. MSX-250 laser vapour deposition apparatus which employs KrF gas, at a substrate temperature of 750° C., laser power of 15 mJ and oxygen pressure of 1500 Pa. The irradiating laser was a $CO_2$ laser operating at a frequency of 28 THz, and the irradiating power was 10 mW.

In the electronic element in the upper part of FIG. 5, the laser light was irradiated perpendicular to the (100) plane of $SrTi_{1-x}Nb_xO_3$, and in the electronic element in the lower part of FIG. 5, the laser light was irradiated perpendicular to the (001) plane of $La_{2-x}Sr_xCuO_{4-o}$. In this case, approximately ⅓ of the power is transmitted through a 50 nanometer Pd film. An initialization step is required due to heating prior to measurement.

Figure 6:
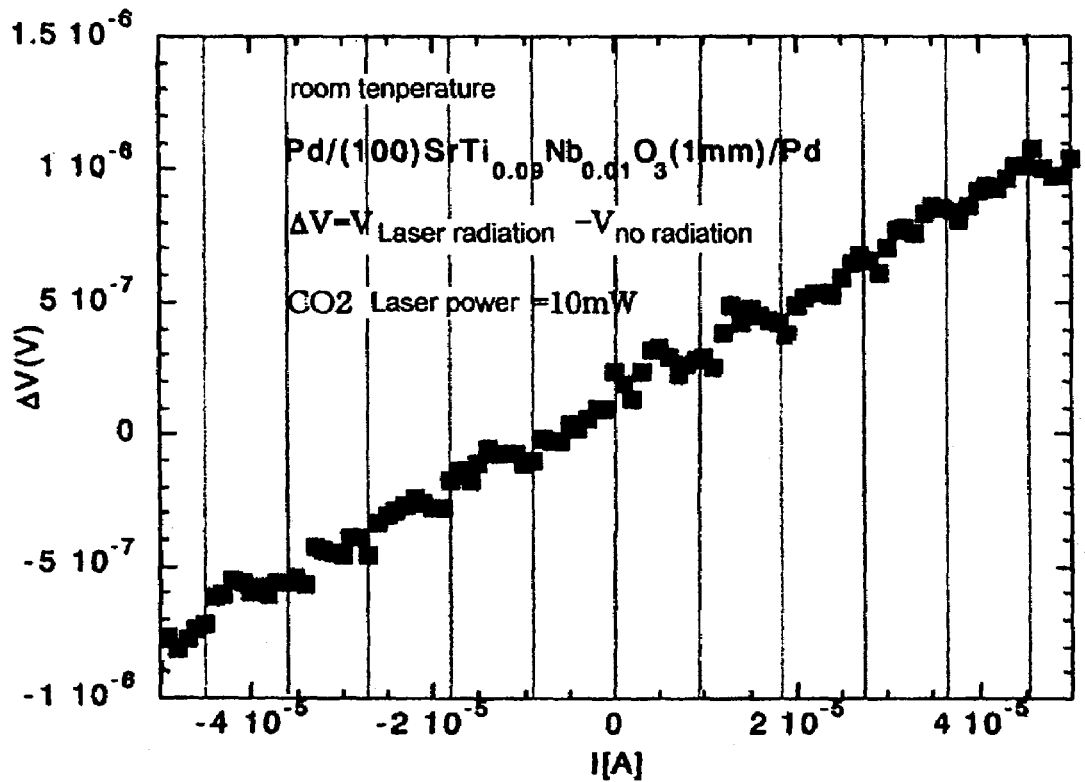
FIG. 6 shows the measurement results for a $Pd/SrTi_{1-x}Nb_xO_3$ (1 mm, x=0.01)/Pd element. The vertical axis shows the result of subtracting the voltage when there is no irradiation from the voltage during laser irradiation, and horizontal axis shows the element current value.
Figure 7:
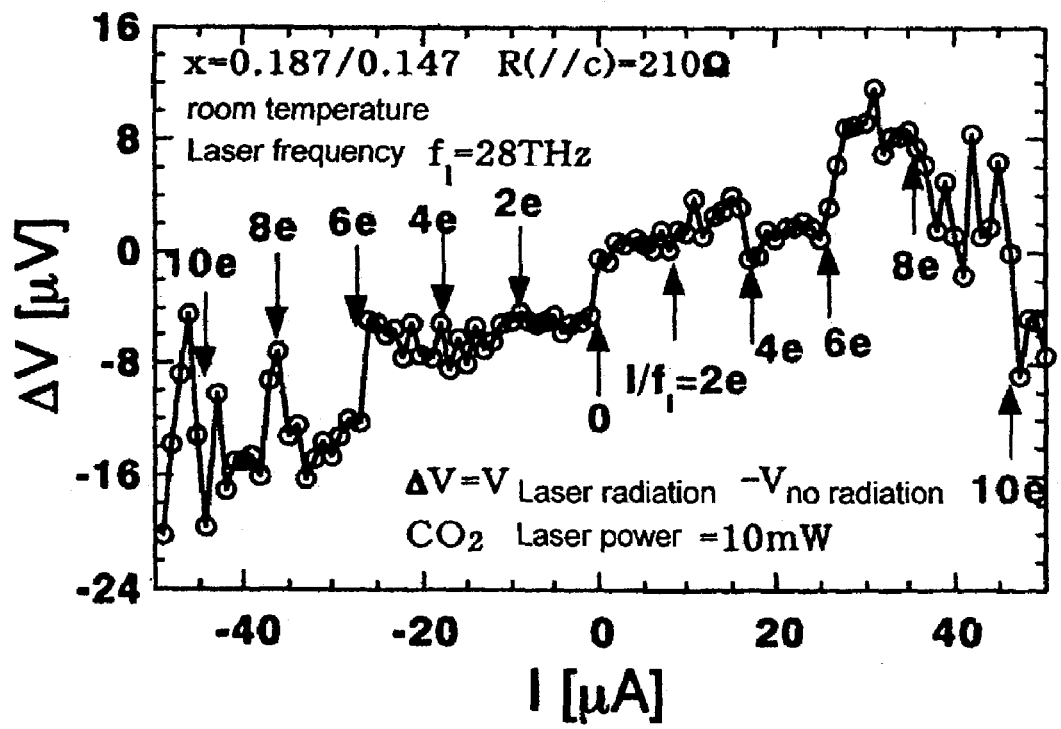
FIG. 7 shows the measurement results for a $Pd/La_{2-x}Sr_xCuO_{4-o}/SrTi_{1-x}Nb_xO_3$ (1 mm, x=0.01)/Pd element. The vertical axis shows the result of subtracting the voltage when there is no irradiation from the voltage during laser irradiation, and the horizontal axis shows the element current value. To enhance resistivity, the $La_{2-x}Sr_xCuO_{4-o}$ thin film has a two-phase structure wherein the film thickness of a film having a doping amount of 0.187 is 50 nm, and the film thickness of a film having a doping amount of 0.147 is 50 nm.

FIGS. 6, 7 show the measurement results at room temperature. The voltage difference obtained by subtracting the voltage without irradiation from the measured element voltage during irradiation, was plotted on the vertical axis, and the element current was plotted on the horizontal axis. FIG. 6 shows the case of the element structure in the upper part of FIG. 5, and shows the properties of $SrTi_{1-x}Nb_xO_3$. FIG. 7 shows the measurement results for the element structure in the lower part of FIG. 5, and shows the properties of a $La_{2-x}Sr_xCuO_{4-o}$ film. With the $La_{2-x}Sr_xCuO_{4-o}$ film, the resistance of the film is increased by adopting a two-phase structure, the film thickness with a doping amount x of 0.187 being 50 nanometers and the film with a doping amount x of 0.147 being 50 nanometers. This is so that, by sufficiently increasing the thin film resistance due to the resistance of the substrate $SrTi_{1-x}Nb_xO_3$, the element resistance is determined mainly by the $La_{2-x}Sr_xCuO_{4-o}$ thin film, and the substrate characteristics can be ignored.

In both FIGS. 6 and 7, it is observed that a remarkable voltage variation occurs for the current value when the laser frequency is applied to an electron charge e or electron pair charge 2e. This means that the "fractional quantum Hall effect" passes through the crystal perpendicular to the two-dimensional plane in an integral proportion per. 1 Hz of laser light, and shows that an interference effect due to quantum resonance has occurred.

What is claimed is:

1. An electronic element comprising (a) a layer of a doped crystal having two opposing surfaces, the doped crystal including a two-dimensional plane that confers two-dimensional conduction properties to the crystal, wherein the doped crystal is oriented such that, in the presence of an electrical field during operation of the electronic element, the two-dimensional plane is oriented effectively perpendicularly to the electrical field, and further wherein the electrostatic capacitance of the layer of the doped crystal is negative at room temperature and (b) said two opposing surfaces of the doped crystal being disposed between two electrodes, wherein the thickness of said layer of doped crystal between said electrodes is in the vicinity of $n\lambda_p/2$, where $$\lambda_p = 2\pi c (\in M/N_e Q^2)^{1/2}$$

wherein c is the speed of light, $\in$ is the dielectric constant of the crystal, M is the valence electron mass, $N_e$ is the valence electron density, Q is the valence electron charge and n is an integer.

2. An electronic element according to claim 1, wherein said opposing surfaces of said layer of doped crystal are each in contact with one of said electrodes.

3. An electronic element according to claim 1, said element being in a ground state of a "fractional quantum Hall effect" wherein the doping amount of the crystal is 0.05 or less, or if localization is introduced, 0.6 or less, and when localization is introduced, the amount of doping of the crystal is varied in relation to the degree of localization.

4. An electronic element according to claim 1, wherein said crystal is a perovskite crystal.

5. An electronic element according to claim 4, wherein said perovskite crystal is $SrTiO_3$ or $La_2CuO_4$.

6. An electronic element according to claim 3, wherein said crystal is a perovskite crystal.

7. An electronic element according to claim 4, wherein said perovskite crystal is $SrTiO_3$ or $La_2CuO_4$.

8. An electronic element operable at room temperature comprising (a) a layer of a doped crystal having two opposing surfaces, the doped crystal including a two-dimensional plane that confers two-dimensional conduction properties to the crystal, wherein the doped crystal is oriented such that, in the presence of an electrical field during operation of the electronic element, the two-dimensional plane is oriented effectively perpendicularly to the electrical field and (b) said two opposing surfaces of the doped crystal each being between two electrodes, wherein the thickness of said layer of doped crystal between said electrodes is in the vicinity of $n\lambda_p/2$, where $$\lambda_p = 2\pi c (\in M/N_e Q^2)^{1/2}$$

wherein c is the speed of light, $\in$ is the dielectric constant of the crystal, M is the valence electron mass, $N_e$ is the valence electron density, Q is the valence electron charge and n is an integer.

9. An electronic element according to claim 8, said element being in a ground state of a "fractional quantum Hall effect" wherein the doping amount of the crystal is 0.05 or less, or if localization is introduced, 0.6 or less, and when localization is introduced, the amount of doping of the crystal is varied in relation to the degree of localization.

10. An electronic element according to claim 8, wherein said crystal is a perovskite crystal.

11. An electronic element according to claim 9, wherein said crystal is a perovskite crystal.

12. An electronic element according to claim 10, wherein said perovskite crystal is $SrTiO_3$ or $La_2CuO_4$.

13. An electronic element according to claim 11, wherein said perovskite crystal is $SrTiO_3$ or $La_2CuO_4$.

14. An electronic element according to claim 8, wherein said opposing surfaces of said layer of doped crystal are each in contact with one of said electrodes.

* * * * *